US005780363A

United States Patent [19]
Delehanty et al.

[11] Patent Number: 5,780,363
[45] Date of Patent: Jul. 14, 1998

[54] ETCHING COMPOSITION AND USE THEREOF

[75] Inventors: Donald John Delehanty, Wappingers Falls, N.Y.; Rangarajan Jagannathan, South Burlington, Vt.; Kenneth John McCullough, Fishkill, N.Y.; Donna Diane Miura, Hopewell Junction, N.Y.; George F. Ouimet, Jr., Millbrook, N.Y.; David Lee Rath, Stormville, N.Y.; Bryan Newton Rhoads, Pine Bush, N.Y.; Frank John Schmidt, Jr., Highland Falls, N.Y.

[73] Assignee: International Business Machines Coporation, Armonk, N.Y.

[21] Appl. No.: 832,999

[22] Filed: Apr. 4, 1997

[51] Int. Cl.$^6$ ...................................................... C23F 1/10
[52] U.S. Cl. .......................... 438/748; 438/745; 438/906; 216/92; 252/79.2
[58] Field of Search .......................... 252/79.2; 438/748, 438/745, 906; 216/92

[56] References Cited

U.S. PATENT DOCUMENTS

| 4,267,013 | 5/1981 | Iida et al. | 156/643 |
|---|---|---|---|
| 4,285,763 | 8/1981 | Coldren | 156/643 |
| 4,325,984 | 4/1982 | Galfo et al. | 427/38 |
| 4,351,696 | 9/1982 | Radigan | 156/643 |
| 4,444,618 | 4/1984 | Saia et al. | 156/643 |
| 4,472,237 | 9/1984 | Deslauriers et al. | 156/643 |
| 4,547,260 | 10/1985 | Takada et al. | 156/643 |
| 4,692,205 | 9/1987 | Sachdev et al. | 156/643 |
| 4,899,767 | 2/1990 | McConnell et al. | 134/56 R |
| 4,962,049 | 10/1990 | Chang et al. | 437/13 |
| 4,985,113 | 1/1991 | Fujimoto et al. | 156/643 |
| 5,037,506 | 8/1991 | Gupta et al. | 156/646 |
| 5,082,518 | 1/1992 | Molinaro | 156/345 |
| 5,217,570 | 6/1993 | Kadomura | 156/665 |
| 5,334,332 | 8/1994 | Lee | 252/548 |
| 5,348,619 | 9/1994 | Bohannon et al. | 156/664 |
| 5,350,488 | 9/1994 | Webb | 156/643 |
| 5,419,779 | 5/1995 | Ward | 134/38 |
| 5,468,342 | 11/1995 | Nulty et al. | 156/643.1 |
| 5,475,267 | 12/1995 | Ishii et al. | 257/752 |
| 5,533,635 | 7/1996 | Man | 216/67 |
| 5,556,482 | 9/1996 | Ward et al. | 134/38 |
| 5,591,299 | 1/1997 | Seaton et al. | 156/626.1 |
| 5,650,041 | 7/1997 | Gotoh et al. | 156/653.1 |
| 5,698,503 | 12/1997 | Ward et al. | 510/176 |
| 5,709,756 | 1/1998 | Ward et al. | 134/1.3 |

*Primary Examiner*—Marion E. McCamish
*Assistant Examiner*—Cheryl Juska
*Attorney, Agent, or Firm*—Pollock, Vande Sande & Priddy; Tiffany L. Townsend

[57] ABSTRACT

An aqueous etchant composition containing about 0.01 to about 15 percent by weight of sulfuric acid and about 0.01 to about 20 percent by weight of hydrogen peroxide or about 1 to 30 ppm of ozone is effective in removing polymer residue from a substrate, and especially from an integrated circuit chip having aluminum lines thereon.

19 Claims, No Drawings

ETCHING COMPOSITION AND USE THEREOF

DESCRIPTION

1. Technical Field

The present invention is concerned with an etchant composition and especially with a composition that is capable of removing polymer residue present on a substrate due to a previous reactive ion etching process. In addition, the present invention is directed to a method for removing such polymer residue by employing the etchant compositions of the present invention.

2. Background of the Invention

Aluminum and aluminum alloys are frequently used for the "metallizations" in large scale integrated circuits. The aluminum alloys include those with small amounts of copper for reducing the potential for electromigration effects where current applied to the device induces transport of the aluminum. Small amounts of silicon or titanium have been added to aluminum in order to minimize the possibility of electrical spiking that can occur in contact holes.

In order to form the patterned metallization, a series of process steps are carried out. These include depositing a layer containing aluminum, coating a photoresist film onto the aluminum containing layer, creating in the photoresist film an image of the predetermined required pattern, such as by exposing selected portions of the photoresist film to light passing through a mask or grating, and then removing either the exposed or unexposed portions of the photoresist film, depending upon the type of resist employed, and finally removing the aluminum or aluminum alloy layer in the regions not masked by the remaining photoresist film. Next, the remaining photoresist film can be removed.

More particularly, aluminum/copper metal line for BEOL wiring/interconnect in semiconductor devices are currently delineated by a reactive ion etching process. Such a process involves patterning the aluminum/copper metal layer with a photoresist and then reactive ion etching in a chlorine environment using boron trichloride, HCl gas or $Cl_2$ in order to etch away the exposed aluminum/copper layer. However, such etching process leaves a residue around the metal lines which consist of complex polymeric oxides or aluminum along with incorporating chlorine into an organic matrix. This is typically referred to as sidewall polymer residue, and its presence is a troublesome source of corrosion of the Al/Cu lines when exposed to the environment such as atmospheric air and/or humidity. Moreover, trace amounts of chlorine over time break down the passivating layer of aluminum oxide and corrode the underlying aluminum.

Accordingly, methods are suggested for removing this sidewall polymer residue. One of the more popular method employs a chromic/phosphoric acid bath. However, this procedure is only marginally effective. Moreover, the chromic/phosphoric acid bath tends to cause some electrochemical etching of aluminum, especially near tungsten studs, which are typically present, thereby causing degradation of the aluminum metal layer.

Accordingly, providing an etching process capable of removing the sidewall polymer residue that does not etch the aluminum to any undesired extent, while removing the sidewall polymer residue would be desirable.

SUMMARY OF INVENTION

The present invention provides an etchant composition that is capable of removing polymer residue and does not adversely effect the aluminum lines. Moreover, the etching composition of the present invention is quite acceptable from an environmental point of view.

The etchant composition of the present invention is an aqueous solution containing about 0.01 to about 15 percent by weight of sulfuric acid and about 0.01 to about 20 percent by weight of hydrogen peroxide, or about 1 to about 30 ppm of ozone.

Another aspect of the present invention is concerned with removing polymer residue from a substrate which comprises contacting the substrate with an aqueous solution containing about 0.01 to about 15 percent by weight of sulfuric acid, and about 0.01 to about 20 percent by weight of hydrogen peroxide, or about 1 to about 30 ppm of ozone.

Still other objects and advantages of the present invention will become readily apparent to those skilled in this art from the following detailed description, wherein it shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

The etchant compositions of the present invention are aqueous solutions containing about 0.01 to about 15 percent by weight and preferably about 1 to about 10 percent by weight of sulfuric acid and about 0.01 to about 20 percent by weight of hydrogen peroxide and preferably about 1 to about 10 percent by weight of hydrogen peroxide or about 1 to about 30 ppm and preferably about 5 to about 20 ppm of ozone with the balance being substantially water. A preferred composition of the present invention is an aqueous solution of about 5 percent by weight of sulfuric acid, about 1.5 percent by weight of hydrogen peroxide and the remainder being substantially water. This composition is preferably employed at temperatures of about 35° C. Another preferred composition of the present invention is an aqueous solution of about 2 percent by weight sulfuric acid, about 5 percent by weight hydrogen peroxide and the remainder being substantially water. Other preferred compositions of the present invention are an aqueous solution of about 4.3% by weight of sulfuric acid, about 0.8% by weight of hydrogen peroxide and the remainder being substantially water; an aqueous solution of about 4.3% by weight of sulfuric acid, about 1.6% by weight of hydrogen peroxide and the remainder being substantially water; an aqueous solution of about 8.6% by weight of sulfuric acid, about 0.8% by weight of hydrogen peroxide and the remainder being substantially water; an aqueous solution of about 8.6% by weight of sulfuric acid, about 1.6% by weight of hydrogen peroxide and the remainder being substantially water; an aqueous solution of about 13% by weight of sulfuric acid, about 2.5% by weight of hydrogen peroxide and the remainder being substantially water; and an aqueous solution of about 13% by weight of sulfuric acid, about 1.6% by weight of hydrogen peroxide and the remainder being substantially water. This composition is preferably employed at temperatures of about 55° C. and is especially preferred for removing thicker and more tenacious sidewall polymer. The water employed is preferably deionized water.

These etchant compositions of the present invention can be prepared by admixing an aqueous sulfuric acid such as a 98 percent by weight solution with an aqueous solution of hydrogen peroxide such as a 30 percent by weight solution and adding these solutions to water in an amount to provide the desired percentage of the sulfuric acid and hydrogen peroxide.

The compositions containing the ozone can be prepared by bubbling ozone gas into the aqueous composition containing the desired amounts of sulfuric acid and water, or diffusing ozone gas through a membrane into water and then adding sulfuric acid to the water, or by any other suitable method.

The etchant compositions of the present invention remove the sidewall polymer residue remaining after the reactive ion etching and with it removes any embedded chlorine. Furthermore, the etchant compositions of the present invention, at most, only mildly etch the aluminum/copper line. In most cases, no evidence of any local etching of the aluminum, even aluminum in the vicinity of tungsten studs, has been observed. The tungsten seems to act as a catalyst in etching aluminum when using the prior art chromic/phosphoric acid bath.

The etchant compositions of the present invention also result in the formation of a pristine native oxide of aluminum which acts as a passivating layer against subsequent corrosion. For instance, an oxide thickness of about 30 angstroms as measured by Auger Spectroscopy is obtained using an etchant composition at about 45° C. containing about 2.4 percent by weight of sulfuric acid and about 0.75 percent by weight of hydrogen peroxide.

The above disclosed relative amounts of components of the composition tend to prevent redeposition of the polymer residue. This occurs by having the pH of the etchant such that the charges of the zeta potentials of the aluminum oxide species and the silicon oxide surface of the substrate cause a repulsion interaction between the surfaces. The desired pH is ensured by observing the amounts of ingredients mentioned above. The zeta potential reflects the charge induced on a surface caused by the interactions of that surface with the ions in the solution, primarily, hydrogen and hydroxide. At a certain solution pH, the net surface charge will be zero which occurs at about pH 2 to 3 for silica and at about pH 9 to 10 for alumina. When the pH is less than this point of zero charge, the charge on the surface would be positive. For the case of a polymer residue removed in an acid medium, the propensity of redeposition of the residue on either the oxidized aluminum surface or on the silica dielectric material is reduced because all surfaces would have a charge of the same sign with zeta potentials also of the same sign.

The etchants of the composition can be used to contact the substrate where the polymer residue is to be removed by any known technique, such as dipping in a bath or preferably spraying the composition on the substrate or silicon wafer having the aluminum copper lines thereon. Typically, the composition is sprayed at a temperature of about 25° to about 95° C. and preferably at a temperature of about 40° to about 50° C. for about 1 to about 8 minutes, typical of which is about 2 minutes. Following this, the water can be subjected to a deionized water rinse followed by drying.

The process of the present invention is also capable of removing chlorine embedded material along with the aluminum/copper sidewall polymer residue. The aluminum/copper profiles achieved by the present invention can be smoother than those in the prior art and are capable of being substantially free of electrochemical or accelerated etching of Al/Cu lines near tungsten studs.

The following Table 1 illustrates various etch rates of the polymer residue with the etchant compositions of the present invention. The percentages in Table 1 are volume percents for 96 percent by weight $H_2SO_4$ and 30 percent by weight of $H_2O_2$.

TABLE 1

Etch rate of Al/Cu with sulfuric/peroxide
Etch rate of AlCu samples (Gravimetry)

| Sulfuric (percent) | Peroxide (percent) | Etch rate[1] (Angstroms/min) | Temperature (C.) |
|---|---|---|---|
| 2.5 | 2.5 | 51/116 | 35/45 |
| 2.5 | 5.0 | 57/109 | 35/45 |
| 5.0 | 2.5 | 68/148 | 35/45 |
| 5.0 | 5.0 | 59/136 | 35/45 |
| 7.5 | 5.0 | 78 | 35 |
| 7.5 | 7.5 | 77 | 35 |

[1]Etch rate increases with temperature

The percentages shown in the above Table 1 are exemplary only and others within the scope of the invention can likewise be employed. In this disclosure there are shown and described only the preferred embodiments of the invention, but, as aforementioned, it is to be understood that the invention is capable of use in various combinations and environments and is capable of changes or modifications within the scope of the inventive concept as expressed herein.

What is claimed is:

1. A method for removing polymer residue from a substrate which comprises contacting said substrate with an aqueous solution containing about 0.01 to about 15 percent by weight of sulfuric acid and about 0.01 to about 20 percent by weight of hydrogen peroxide, or containing about 0.01 to about 15 percent by weight of sulfuric acid and about 1 to about 30 ppm of ozone.

2. The method of claim 1 which comprises spraying said aqueous solution onto said substrate.

3. The method of claim 2 wherein the temperature of said aqueous solution during said spraying is about 25° to about 95° C.

4. The method of claim 2 wherein the temperature of said aqueous solution during said spraying is about 40° to about 50° C.

5. The method of claim 2 wherein said spraying is carried out for about 1 to about 8 minutes.

6. The method of claim 8 wherein said substrate is a integrated circuit wafer having metal lines thereon and containing residue from a prior reactive ion etching process.

7. The method of claim 2 wherein said metal lines are AlCu alloy lines.

8. The method of claim 6 wherein said metal lines are Al.

9. The method of claim 6 wherein said substrate also contains tungsten studs near said metal lines.

10. The method of claim 6 wherein said reactive ion etching uses boron trichloride, HCl gas or $Cl_2$.

11. The method of claim 1 wherein said solution comprises about 0.01 to about 15 percent by weight of sulfuric acid and about 0.01 to about 20 percent by weight of hydrogen peroxide.

12. The method of claim 1 wherein said solution comprises about 0.01 to about 15 percent by weight of sulfuric acid and about 1 to about 30 ppm of ozone.

13. The method of claim 1 wherein said solution comprises about 1 to about 10 percent by weight of sulfuric acid and about 1 to about 10 percent by weight of hydrogen peroxide.

14. the method of claim 1 wherein said solution comprises about 5 percent by weight of sulfuric acid and about 1.5 percent by weight of hydrogen peroxide.

15. The method of claim 1 wherein said solution comprises about 2 percent by weight of sulfuric acid and about 5 percent by weight of hydrogen peroxide.

16. The method of claim 1 wherein said solution includes deionized water.

17. The method of claim 1 wherein said solution comprises about 8.6% by weight sulfuric acid and about 1.6% by weight of hydrogen peroxide or about 8.6% by weight of sulfuric acid and about 0.8% by weight of hydrogen peroxide.

18. The method of claim 1 wherein said solution comprises about 13% by weight sulfuric acid and about 2.5% by weight hydrogen peroxide or a solution comprising about 13% by weight of sulfuric acid and about 1.6% by weight of hydrogen peroxide.

19. The method of claim 1 wherein said solution comprises about 4.3% by weight sulfuric acid and about 0.8% by weight hydrogen peroxide or comprises about 4.3% by weight of sulfuric acid and about 1.6% by weight of hydrogen peroxide.

* * * * *

UNITED STATES PATENT AND TRADEMARK OFFICE
CERTIFICATE OF CORRECTION

PATENT NO. : 5,780,363
DATED : July 14, 1998
INVENTOR(S) : Delehanty et al

It is certified that error appears in the above-identified patent and that said Letters Patent is hereby corrected as shown below:

Title page, item [75]; Inventors: should read --Donald John Delehanty, Wappingers Falls, N.Y.; Rangarajan Jagannathan, South Burlington, Vt.; Kenneth John McCullough, Fishkill, N.Y.; Donna Diane Miura, Hopewell Junction, N.Y.; George F. Ouimet, Jr., Millbrook, N.Y.; David Lee Rath, Stormville, N.Y.; Bryan Newton Rhoads, Pine Bush, N.Y.; Frank John Schmidt, Jr., Highland Falls, N.Y.

Signed and Sealed this

Fifteenth Day of September, 1998

Attest:

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. : 5,780,363
DATED : July 14, 1998
INVENTOR(S): Delehanty et al It is certified that error appears in the above-identified patent and that said Letters Patent is hereby corrected as shown below:

Title page, [73] Assignee: should read --International Business Machines Corporation, Armonk, N.Y.--

Signed and Sealed this

Ninth Day of February, 1999

Attest:

*Acting Commissioner of Patents and Trademarks*

Attesting Officer